US012699139B2

(12) United States Patent
Wang

(10) Patent No.: US 12,699,139 B2
(45) Date of Patent: Aug. 4, 2026

(54) BATTERY PACK DETECTION CONNECTION APPARATUS AND BATTERY PACK DETECTION SYSTEM

(71) Applicant: Autel Digital Power Co., Ltd., Shenzhen (CN)

(72) Inventor: Weilin Wang, Shenzhen (CN)

(73) Assignee: AUTEL DIGITAL POWER CO., LTD., Shenzhen (CN)

( * ) Notice: Subject to any disclaimer, the term of this patent is extended or adjusted under 35 U.S.C. 154(b) by 289 days.

(21) Appl. No.: 18/291,932

(22) PCT Filed: Sep. 1, 2022

(86) PCT No.: PCT/CN2022/116500
§ 371 (c)(1),
(2) Date: Jan. 25, 2024

(87) PCT Pub. No.: WO2023/030442
PCT Pub. Date: Mar. 9, 2023

(65) Prior Publication Data
US 2024/0345167 A1 Oct. 17, 2024

(30) Foreign Application Priority Data

Sep. 3, 2021 (CN) .......................... 202111033915.9

(51) Int. Cl.
*G01R 31/367* (2019.01)
*G01R 31/388* (2019.01)
*G01R 31/396* (2019.01)
(52) U.S. Cl.
CPC ......... *G01R 31/367* (2019.01); *G01R 31/388* (2019.01); *G01R 31/396* (2019.01)
(58) Field of Classification Search
CPC .. G01R 31/367; G01R 31/388; G01R 31/396; G01R 31/385
See application file for complete search history.

(56) References Cited

U.S. PATENT DOCUMENTS

2018/0225891 A1 8/2018 Lambourne

FOREIGN PATENT DOCUMENTS

CN 101355379 A 1/2009
CN 102202058 A * 9/2011
(Continued)

OTHER PUBLICATIONS

TCAN4550 Automotive Control Area Network Flexible Data Rate (CAN FD) Controller with Integrated Transceiver, Texas Instruments, 2020 (Year: 2020).*

(Continued)

*Primary Examiner* — Daniel R Miller
(74) *Attorney, Agent, or Firm* — Andrew C. Cheng

(57) ABSTRACT

A battery pack detection connection apparatus includes: a communication module used for communicating with a vehicle communication interface and a battery pack; a microcontroller unit used for extracting change features of an externally inputted signal, performing signal feature reconstruction on the extracted change features of the signal, and transmitting the reconstructed signal features to a function generator or signal module; at least one function generator used for outputting, according to the reconstructed signal features, a first-type waveform signal exchanged between a vehicle and the battery pack; and the signal module used for outputting, according to the reconstructed signal features, a second-type waveform signal exchanged between the vehicle and the battery pack. The present apparatus uses the function generator and the signal module to achieve signals required by the battery pack for interaction. The same hardware can be used to match different brands of vehicle models.

15 Claims, 8 Drawing Sheets

(56)         References Cited

FOREIGN PATENT DOCUMENTS

| | | | | |
|----|----------------|---|---|---|
| CN | 102215261 A | * | 10/2011 | |
| CN | 102866272 A | | 1/2013 | |
| CN | 202854308 U | | 4/2013 | |
| CN | 205005067 U | * | 1/2016 | |
| CN | 106774263 A | | 5/2017 | |
| CN | 109782185 A | | 5/2019 | |
| CN | 210166474 U | | 3/2020 | |
| CN | 212540654 U | | 2/2021 | |
| CN | 112463339 A | | 3/2021 | |
| CN | 113242532 A | | 8/2021 | |
| CN | 214011324 U | | 8/2021 | |
| CN | 113866640 A | | 12/2021 | |
| KR | 20190010003 A | * | 1/2019 | ........... G01R 31/396 |

OTHER PUBLICATIONS

International Search Report of PCT patent application No. PCT/CN2022/116500 issued on Dec. 5, 2022.
The Search Report of CN patent application No. 202111033915.9 issued on Aug. 1, 2024.
The first office action of CN patent application No. 202111033915.9 issued on Aug. 1, 2024.

* cited by examiner (2.4, 4.5)

(line(2.4, 0), 1.4)

(0.85, 2)

(0.35, 1.5)

(0.74, 2)

(0, 510)

BATTERY PACK DETECTION CONNECTION APPARATUS AND BATTERY PACK DETECTION SYSTEM

CROSS-REFERENCE TO RELATED APPLICATIONS

The present application is the National Stage application for International Patent Application No. PCT/CN2022/116500 filed on Sep. 1, 2022, which claims priority to the Chinese patent application No. 202111033915.9 entitled "battery pack detection connection apparatus and battery pack detection system" filed on Sep. 3, 2021 to the China National Intellectual Property Administration, the entire contents of which are incorporated herein by reference.

TECHNICAL FIELD

The present application relates to the technical field of battery pack detection, in particular to a battery pack detection connection apparatus and a battery pack detection system.

BACKGROUND OF THE INVENTION

At present, new energy vehicles have become a priority for consumers to purchase vehicles for their clean and environmental protection features. Battery pack (PACK) as one core component of new energy vehicles, its function management is particularly important. A battery pack management system (BMS) is one of the tools to manage battery packs.

A battery pack management system has functions such as communication management, battery voltage, electric quantity, temperature monitoring, charge and discharge management, battery equalization, insulation safety management and battery heating and cooling. These functions need to be verified when performing battery pack EOL (End Of Line) or offline verification. For safety, by default, the battery pack high voltage is in a disconnected state and is not output to the outside, and the battery pack management system determines whether to output the high voltage only after judging whether the following corresponding conditions are satisfied. The conditions affecting the output of the battery pack high voltage include but are not limited to:

(1) whether the high voltage interlocking safety signal is OK;

(2) whether the airbag signal is OK;

(3) whether the safety certification information is OK; and (4) whether the ignition switch is turned on or not.

Only if these conditions are met can the battery pack management system pull in the high-voltage relay, allowing the battery pack to output high voltage. In the detection of the battery pack, the battery pack voltage measurement, the voltage sensor verification, the battery insulation resistance measurement, the insulation monitoring detection of the battery pack management system, the charge and discharge test, etc. all require the battery pack to output a high voltage, and the test environment requires to construct a signal interaction satisfying the battery pack, so that the battery pack management system can pull in the high-voltage relay to enable the battery pack to output a high voltage.

As described above, the battery pack management system allows the battery pack to output a high voltage only after the battery pack management system detects that the interlock, the airbag, the ignition switch signal OK, and the safety certification pass. Since there are differences in these interactive signals on different brands of vehicles or various vehicle models of the same brand, the safety certification scheme implemented also has the problem of inconsistency. If the same fixed hardware implementation is adopted, there will certainly be the problem of limited use range, and the universality of hardware cannot be effectively played.

SUMMARY OF THE INVENTION

The embodiments of the present invention are intended to provide a battery pack detection connection apparatus and a battery pack detection system, which can realize various signals required for battery pack interaction by adopting two control modes, i.e. a function generator and a signal module, solve the problem of signal versatility, and reduce the design cost and enhance the design function, so that the same hardware can be used to match different brands of automobiles or multiple vehicle models of the same brand of automobiles, increase the scope of use of the hardware and effectively exert the versatility of the hardware.

In order to solve the above technical problems, embodiments of the present invention provide the following technical solutions: a battery pack detection connection apparatus comprising: a microcontroller Unit, at least one function generator, a signal module, and a communication module; wherein:

the communication module is used for communicating with a vehicle communication interface and a battery pack by using a preset bus;

the microcontroller Unit is respectively communicatively connected to the vehicle communication interface, the function generator, and the signal module via the communication module, and is used for extracting a change feature of a signal input externally via the vehicle communication interface, performing signal feature reconstruction on an extracted change feature of the signal, transmitting the reconstructed signal feature to the function generator or the signal module according to an attribute of the reconstructed signal feature, and controlling the function generator or the signal module to output a reconstructed signal waveform according to the reconstructed signal feature;

the function generator is used for outputting a first-type waveform signal exchanged between a vehicle and the battery pack according to the reconstructed signal feature transmitted by the microcontroller Unit;

and the signal module is used for outputting a second-type waveform signal exchanged between a vehicle and the battery pack according to the reconstructed signal feature transmitted by the microcontroller Unit.

Optionally, the preset bus comprises a CAN bus, wherein the battery pack detection connection apparatus is connected to the CAN bus, the battery pack detection connection apparatus provides all signals for interfacing with the battery pack, and a communication interaction with the battery pack is performed via the CAN bus.

Optionally, the preset bus comprises a UART, and the battery pack detection connection apparatus communicates with the vehicle communication interface via the UART or the CAN bus.

Optionally, the microcontroller Unit is connected to the vehicle communication interface and extracts the change feature of a signal input externally through the vehicle communication interface, comprising: with regard to a periodic signal input externally through the vehicle communication interface, firstly performing signal period decomposition, and then extracting a change feature of the signal within one signal period; wherein the extracting the change feature of the signal is implemented by using a sampling method, and the signal is sampled at a certain time interval to acquire a sampling voltage of the signal.

Optionally, the microcontroller Unit represents the extracted change features of the signal by using a preset sequence pair, wherein in the preset sequence pair, if part of the signal may continuously change according to a certain law within a certain time, the part of the signal may be represented by a function, and the function is nested in the preset sequence pair.

Optionally, the preset sequence pair comprises a sequence pair of a voltage and hold time.

Optionally, a plurality of interactive signals or a plurality kinds of interactive signals or interaction messages exist between the battery pack detection connection apparatus and the vehicle communication interface and the battery pack, each kind of interactive signal or message is cut into one periodic task, and a delay influence factor of each periodic task is set.

Optionally, the delay influence factor comprises a high delay influence factor, a medium delay influence factor, and a low delay influence factor;

when an interaction period value is less than or equal to a first preset period value, the delay influence factor is the high delay influence factor, and the delay influence factor value is a first preset delay influence factor value;

when the interaction period value is greater than or equal to a second preset period value, the delay influence factor is the low delay influence factor, and the delay influence factor value is a second preset delay influence factor value;

and when the interaction period value is between the first preset period value and the second preset period value, the delay influence factor is the medium delay influence factor, and the delay influence factor value is calculated by a linear function, wherein the linear function is linearly determined by a straight line formed by the first preset delay influence factor value and the second preset delay influence factor value.

Optionally, the battery pack detection connection apparatus is divided into three queues at a software level: ready queue, running queue, and emergency execution queue; wherein:

the ready queue is used for storing a task waiting to be executed; the running queue is used for storing a task that is due to be executed or a task with a medium or low delay influence factor; and the emergency execution queue is used for storing an emergency execution task or a task with a high delay influence factor; wherein the task waiting to be executed comprises a task sent by the vehicle communication interface to the microcontroller Unit, and/or a periodic task between the battery pack detection connection apparatus and the battery pack.

Optionally, a task affiliation in the ready queue is determined according to a task attribute or a delay influence factor, comprising scenarios as follows: if the task is event-type and quite urgent, the task is put into the emergency execution queue for execution; for a periodic task, if the delay influence factor of the task is high, the task is put into the emergency execution queue for execution, and the emergency execution queue uses a First Input First Output scheduling strategy for execution to ensure timeliness of task execution; and if the delay influence factor of a task is medium or low, the task is put into a running queue for execution, and the running queue firstly selects a task with a high delay influence factor value for execution, and executes the task with a First Input First Output scheduling strategy under a same delay influence factor.

Optionally, the microcontroller Unit executes concurrent tasks according to a preset execution strategy, wherein the preset execution strategy comprises: the microcontroller Unit first executing an emergency execution task in the emergency execution queue, taking out one task for execution from the running queue after the execution is completed, and then checking whether there is a need for the emergency execution task or a task due to be executed in the ready queue, and if so, assigning the emergency execution task to the emergency execution queue for execution or assigning the task due to be executed to the running queue for execution.

Optionally, in part of interactive signals between the battery pack detection connection apparatus and the battery pack, a signal hold time is very short, i.e. a short delay holding, and this is implemented by using a loop waiting method within a task.

Optionally, the microcontroller Unit performs signal feature reconstruction on the extracted change features of the signal, comprising:

S1, determining all states in one period of a waveform and a numerical value of each state according to the change feature of the signal; and S2, in one period, setting the function generator or the signal module to execute and output a numerical value in the current state and a numerical value in the next state.

Optionally, the following is further included: a power module for supplying power to the microcontroller Unit, the signal module, and the function generator.

In order to solve the above technical problems, the embodiments of the present invention also provide the following technical solutions: a battery pack detection system, comprising a battery pack and the battery pack detection connection apparatus according to any embodiment of the present invention, wherein the battery pack detection connection apparatus is communicatively connected to the battery pack for, according to an externally input signal, constructing an interactive signal between an automobile and the battery pack to be output a same to the battery pack.

Compared with the prior art, the embodiments of the present invention provide a battery pack detection connection apparatus and a battery pack detection system. The microcontroller Unit is communicatively connected to the VCI, function generator, and signal module through a communication module to extract the change features of a signal externally transmitted to the MCU via the VCI, perform signal feature reconstruction on the extracted change feature of the signal, transmit the reconstructed signal feature to the function generator or the signal module according to the attribute of the reconstructed signal feature, control the function generator to output a first-type waveform signal exchanged between a vehicle and the battery pack according to the reconstructed signal feature, or control the signal module to output a second-type waveform signal exchanged between a vehicle and the battery pack according to the reconstructed signal feature. Therefore, by adopting two control modes of function generator and signal module, the first-type of complex waveform signal is realized by a function generator, and the second-type of simple waveform signal is realized by a signal module such that various signals required for battery pack interaction can be realized, the problem of signal universality can be solved, the design cost can be reduced, and the design function can be enhanced; this supports the simultaneous output of mul-tipath signals, adapts to the requirements of complex test environment, and ensures the timeliness of interactive infor-mation as far as possible, so as to solve the problems of interactive signal differences and inconsistent certification schemes in different brands of automobiles or various vehicle models of the same brand. Therefore, the same hardware can be used to match different brands of automo-biles or various vehicle models of the same brand, the scope of hardware use can be increased, and the universality of hardware can be effectively played.

BRIEF DESCRIPTION OF DRAWINGS

One or more embodiments are exemplified by the draw-ings in the accompanying drawings corresponding thereto. These exemplified descriptions do not constitute a limitation on the embodiments. Elements in the drawings having the same reference number designations are illustrated as simi-lar elements, and unless otherwise particularly stated, the drawings do not constitute a proportional limitation.

Figure 1:
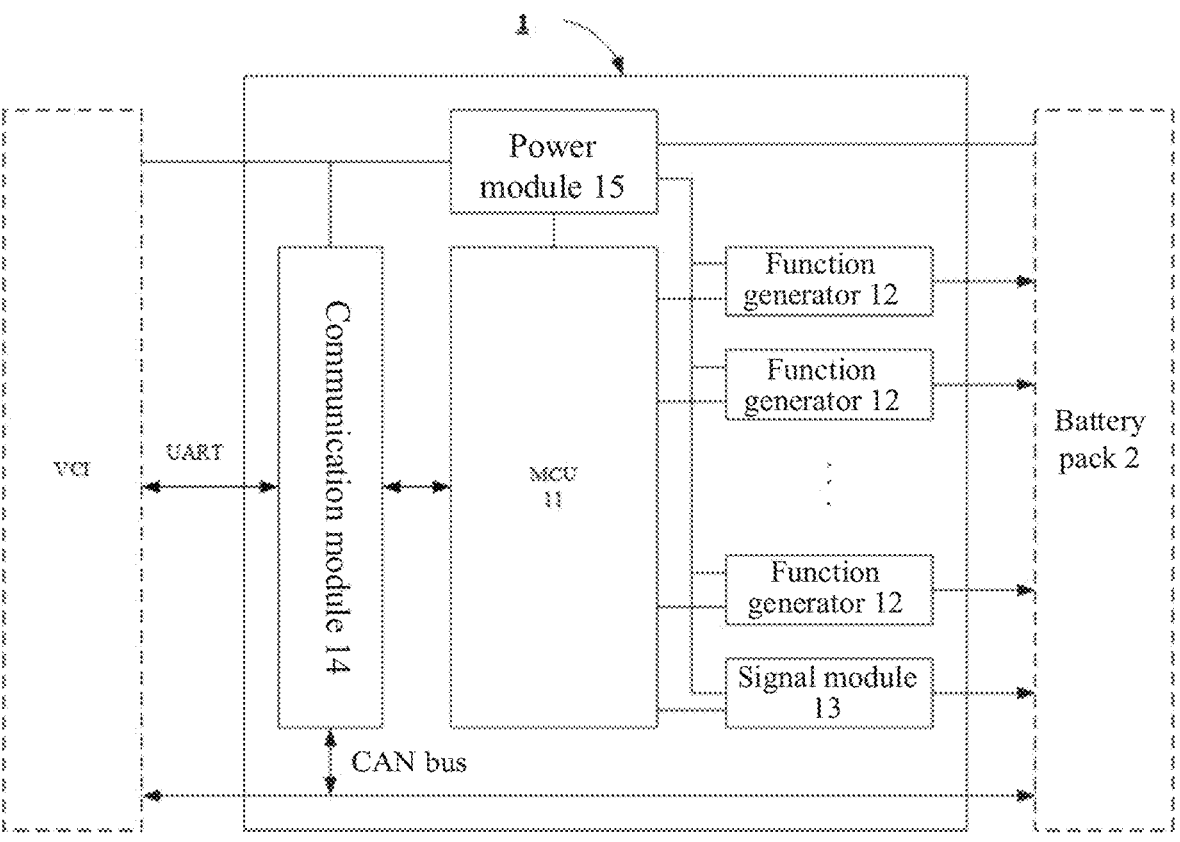
FIG. 1 is a schematic structural diagram of a battery pack detection connection apparatus according to the present invention.

DETAILED DESCRIPTION OF THE INVENTION order to make the present invention readily understood, a more detailed description of the present invention will be rendered with reference to the appended drawings and specific embodiments. It should be noted that when an element is referred to as being "secured" to another element, it can be directly on the other element or one or more intervening elements may be present therebetween. When one element is referred to as being "connected" to another element, it can be directly connected to the other element or one or more intervening elements may be present therebe-tween. In the description, the orientation or positional rela-tionships indicated by the terms used herein "up", "down", "inside", "outside", "bottom" etc. are based on the orienta-tion or positional relationship shown in the drawings, and are only for the convenience of describing the invention and simplifying the description, rather than indicating or imply-ing that the referred device or element must have a specific orientation, or be constructed and operated in a specific orientation, and therefore cannot be construed as a limitation of the present invention. Furthermore, the terms "first", "second", "third", etc. are only used for descriptive purposes and are not to be construed as indicating or implying relative importance.

Unless defined otherwise, all technical and scientific terms used in the specification have the same meaning as commonly understood by one of ordinary skill in the art to which the present invention belongs. In the description, the terminology used in the description of the present invention is for the purpose of describing specific embodiments only and is not intended to limit the present invention. As used herein, the term "and/or" includes any and all combinations of one or more of the associated listed items.

Furthermore, the technical features involved in the dif-ferent embodiments of the present invention described below can be combined with each other as long as they do not conflict with each other.

In one embodiment, as shown in FIG. 1, the present invention provides a battery pack detection connection appa-ratus 1 including: a microcontroller Unit (MCU) 11, at least one function generator 12, a signal module 13, and a communication module 14.

The communication module 14 is used for communicat-ing with a vehicle Vehicle Communication Interface (VCI) and a battery pack using a preset bus.

The microcontroller Unit 11 is respectively communica-tively connected to the VCI, the function generator 12, and the signal module 14 via the communication module 14, and is used for extracting a change feature of a signal externally transmitted to the MCU via the VCI, performing signal feature reconstruction on the extracted change feature of the signal, transmitting the reconstructed signal feature to the function generator 12 or the signal module 13 according to the attribute of the reconstructed signal feature, and control-ling the function generator 12 or the signal module 13 to output a reconstructed signal waveform according to the reconstructed signal feature.

The function generator 12 is respectively connected to the microcontroller Unit 11 and the battery pack via the com-munication module 14, and is used for outputting a first-type waveform signal exchanged between a vehicle and the battery pack according to the reconstructed signal feature transmitted by the microcontroller Unit 11.

The signal module 13 is respectively connected to the microcontroller Unit 11 and the battery pack via the com-munication module, and is used for outputting a second-type waveform signal exchanged between a vehicle and the battery pack according to the reconstructed signal feature transmitted by the microcontroller Unit 11.

In this embodiment, the microcontroller Unit is commu-nicatively connected to the VCI, function generator, and signal module through a communication module to extract the change features of a signal externally transmitted to the MCU via the VCI, perform signal feature reconstruction on the extracted change feature of the signal, transmit the reconstructed signal feature to the function generator or the signal module according to the attribute of the reconstructed signal feature, control the function generator to output a first-type waveform signal exchanged between a vehicle and the battery pack according to the reconstructed signal feature, or control the signal module to output a second-type waveform signal exchanged between a vehicle and the battery pack according to the reconstructed signal feature. Therefore, by adopting two control modes of the function generator and signal module, the first-type of complex waveform signal is realized by a function generator, and the second-type of simple waveform signal is realized by the signal module such that various signals required for battery pack interaction can be realized, the problem of signal universality can be solved, the design cost can be reduced, and the design function can be enhanced; this supports the simultaneous output of multipath signals, adapts to the requirements of complex test environment, and ensures the timeliness of interactive information as far as possible, so as to solve the problems of interactive signal differences and inconsistent certification schemes in different brands of automobiles or various vehicle models of the same brand. Therefore, the same hardware can be used to match different brands of automobiles or various vehicle models of the same brand, the scope of hardware use can be increased, and the universality of hardware can be effectively played.

In one embodiment, as shown in FIG. 1, the preset bus comprises a CAN bus, the battery pack detection connection apparatus 1 is connected to the CAN bus, and the battery pack detection connection apparatus 1 provides all signals for interfacing with the battery pack and performs communication interaction with the battery pack via the CAN bus.

The preset bus comprises a UART (Universal Asynchronous Receiver/Transmitter), and the battery pack detection connection apparatus 1 communicates with the VCI via the UART and may also communicate with the VCI via the CAN bus.

Figure 2:
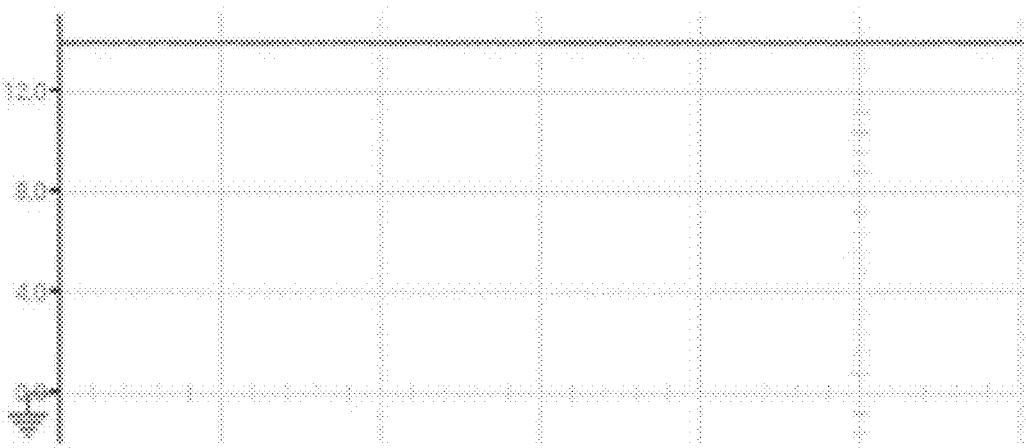
FIG. 2 is a schematic waveform diagram of a constant level interactive signal between an automobile and a battery pack according to the present invention.
Figure 3:
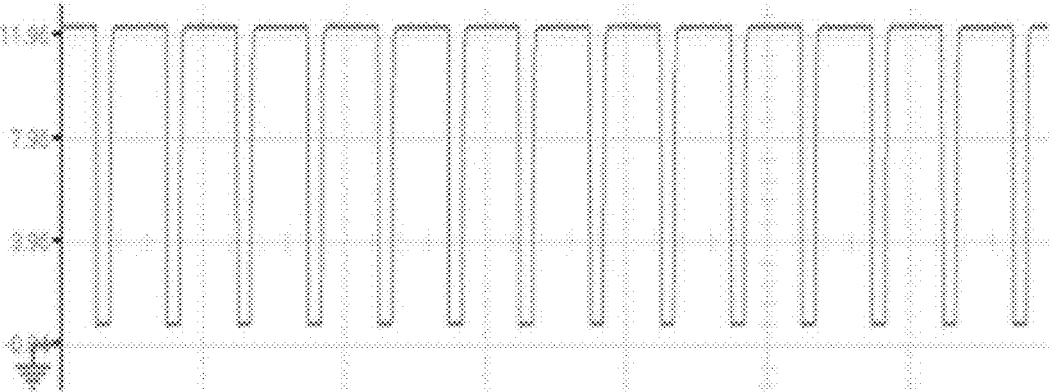
FIG. 3 is a schematic waveform diagram of a PWM square wave interactive signal between an automobile and a battery pack according to the present invention.
Figure 4:
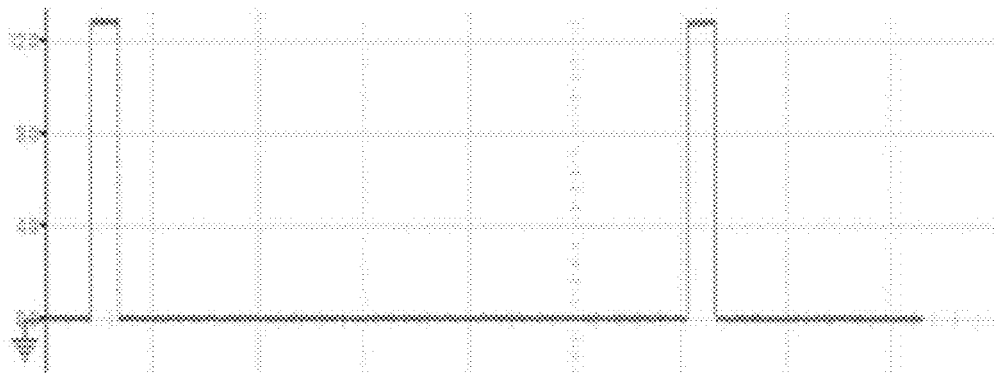
FIG. 4 is a schematic waveform diagram of a pulse interactive signal between an automobile and a battery pack according to the present invention.
Figure 5:
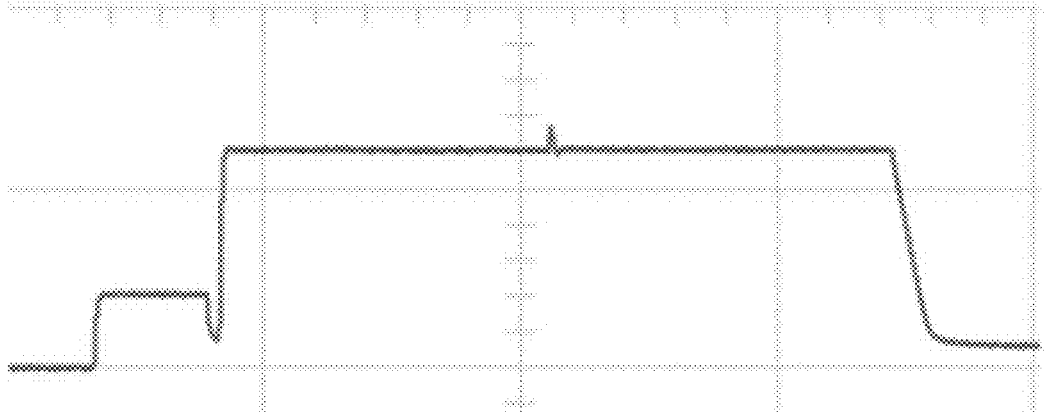
FIG. 5 is a schematic waveform diagram of a complex changing interactive signal between an automobile and a battery pack according to the present invention.
Figure 6:
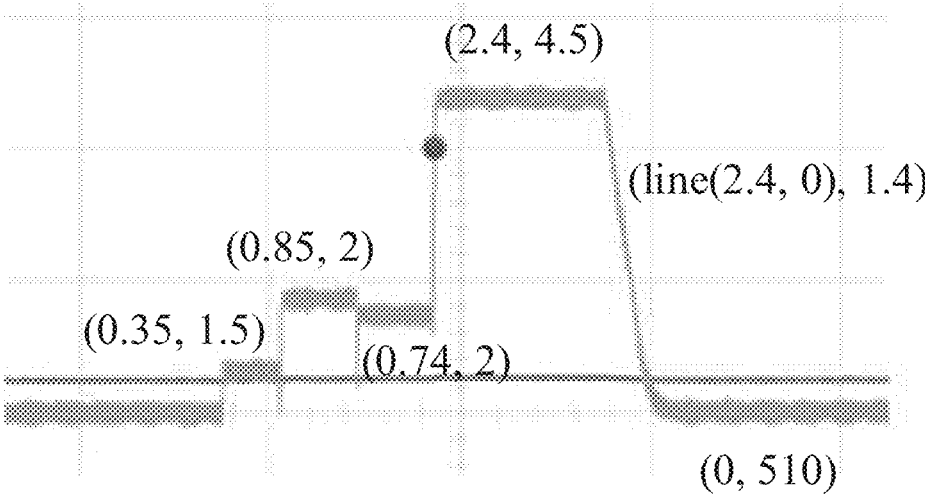
FIG. 6 is a schematic waveform diagram of another complex changing interactive signal between an automobile and a battery pack according to the present invention.
Figure 7:
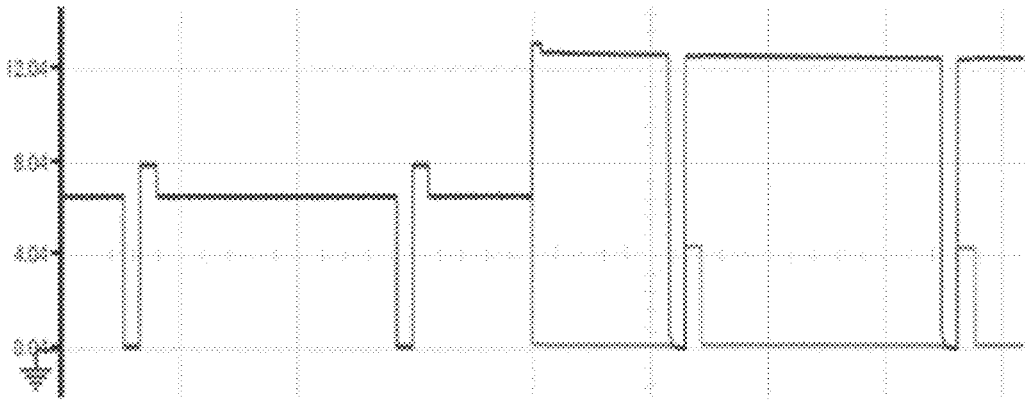
FIG. 7 is a schematic waveform diagram of another complex changing interactive signal between an automobile and a battery pack according to the present invention.

In one embodiment, as shown in FIG. 2, the interactive signal between the automobile and the battery pack includes a constant level signal (as shown in FIG. 2), a PWM (Pulse Width Modulation) square wave signal (as shown in FIG. 3), a pulse signal (as shown in FIG. 4), and various other complex changing waveforms (as shown in FIGS. 5-7). Theoretically, the function generator can output all the waveforms, and all the signals interacting with the battery pack can be constructed using the function generator (the function generator is one hardware chip, such as CPU), but the construction cost of the function generator is high; therefore, the present invention uses two waveform output control strategies as follows: the function generator outputs a first-type waveform signal exchanged with the battery pack, and the signal module outputs a second-type waveform signal exchanged with the battery pack.

The function generator 12 outputs a first-type waveform signal exchanged with the battery pack. The first-type waveform signal comprises an irregularly changing waveform signal, for example, a waveform signal with a less common output waveform and a complex control logic is deployed on a function generator. The MCU controls the function generator to output the waveform. For example, various complex changing waveform signals are shown in FIGS. 5-7.

The signal module 13 outputs a second-type waveform signal exchanged with the battery pack. The second-type waveform signal comprises a simple level signal with a regular change, and this type of signal waveform output control is relatively simple, or MCU supports the same (such as a PWM waveform). Or, it is used in most brands of automobiles, and a proprietary circuit can be built for this part of the waveform to constitute a signal module, and the signal output is controlled by MCU, so as to reduce the design cost. For example, the constant level signal shown in FIG. 2, the PWM square wave signal shown in FIG. 3, and the pulse signal shown in FIG. 4.

In this embodiment, by adopting two control modes of function generator and signal module, the first-type of complex waveform signal is realized by a function generator, and the second-type of simple waveform signal is realized by a signal module such that various signals required for battery pack interaction can be realized, the problem of signal universality can be solved, the design cost can be reduced, and the design function can be enhanced; this supports the simultaneous output of multipath signals, adapts to the requirements of complex test environment, and ensures the timeliness of interactive information as far as possible, so as to solve the problems of interactive signal differences and inconsistent certification schemes in different brands of automobiles or various vehicle models of the same brand. By constructing interactive signals such as high-voltage safety, airbags, and ignition switches through a function generator, various complex waveform outputs can be constructed. Therefore, the same hardware can be used to match different brands of automobiles or various vehicle models of the same brand, the scope of hardware use can be increased, and the universality of hardware can be effectively played.

In one embodiment, the MCU is connected to the VCI to extract change features of a signal transmitted externally to the MCU via the VCI.

The interactive signal between the automobile and the battery pack is either a constant level signal or a periodic signal. For a constant level signal, the setting is typically no longer changed.

For periodic signals, signal period decomposition is performed first, and then the change features of the signal are extracted by the MCU within one signal period. Extracting the change features of the signal can be implemented by using a sampling method, and the signals are sampled at a certain time interval to acquire a sampling voltage of the signal. As long as the sampling interval is short enough, the reconstruction of the subsequent signals is accurate.

In the interactive signals between battery packs, although there are many types of signals, the signals generally remain unchanged for a certain time; therefore, the MCU can use a more concise and less-storage preset sequence pair to represent the extracted change features of the signals; in the preset sequence pair, if part of the signals may continuously change according to a certain law for a certain time within a period, a function can be used to represent the part of signals, and the function is nested in the preset sequence pair.

Preferably, the preset sequence pair comprises a sequence pair of voltage and hold time. The sequence pair of voltage and hold time is shown in the following equation (1):

$$Sig=\{(\text{voltage}_1,\text{holdtime}_1),\ldots,(\text{voltage}_n,\text{holdtime}_n)\} \tag{1}$$

For example, the waveform features of FIG. 6 may be expressed as a sequence of the following equation (2) according to the above-described sequence pair rule of voltage and hold time, where the hold time (holdtime) is in units of milliseconds.

$$Sig=\{(0.35,1.5),(0.85,2),(0.74,2),(2.4,4.5),(\text{line}(2.4,0),1.4),(0,510)\} \tag{2}$$

Among the interactive signals between the battery packs, part of the signals may follow a certain law to continuously change, and may be expressed as a function. For example, in FIG. 6, the last segment can be represented by a linear equation, and labeled by line, (line (2.4, 0), 1.4) representing a voltage changing from 2.4V to 0V, and time-consuming 1.4 ms to follow a linear change.

For example, among the interactive signals between battery packs, the following function signal expressed as a sequence pair of voltage and hold time is also commonly used.

$$y = \frac{b-a}{\text{holdtime}} x + a; \text{Line}(a, b), x \in [0, \text{holdtime}]$$

$$y = M_0 \sin(ax + b) + V_0; \text{Sin}(a, b, M_0, V_0), x \in [0, \text{holdtime}]$$

$$y = ax^2 + bx + c; X2(a, b, c), x \in [0, \text{holdtime}]$$

In the present embodiment, by performing signal period decomposition on a periodic signal, extracting change features of the signal, and with regard to the extracted change features of the signal, using a sequence pair of a voltage and a hold time which is more concise and has less storage to store a signal waveform, the data storage amount is greatly reduced, the storage space is saved, and the implementation efficiency is improved.

In one embodiment, due to the relatively high timeliness requirements for executing functions on the battery pack detection connection apparatus, the execution period is relatively short. Therefore, each independent execution function of the system can be divided into one task block, and a part of the tasks can be executed once according to requirements, and this part of the tasks can be classified as event tasks; some tasks need to be executed periodically, and such tasks are classified as periodic tasks. Tasks on the system are divided into two types. An event message mainly interacts with the VCI, and the VCI sends an execution command to the system. If the execution is not periodic, the event message is generated, and if the execution requirements are periodic, it is arranged to be a periodic task. The connection apparatus of the present invention is primarily responsible for handling part of periodic tasks such as lost-connection checks, handshake messages, indicator light control, etc.

In one embodiment, a plurality of interactive signals or a plurality of interaction messages exist between the battery package detection connection apparatus and the VCI and the battery package, each kind of interactive signals or messages is cut into one periodic task, and a delay influence factor of each periodic task is set so that the system ensures that the interactive signals or interaction messages are delivered in time.

For example, periodic, timely interaction of information, and possibly concurrent interaction of multiple pieces of information, is required between the battery pack detection connection apparatus and the battery pack. At this time, each kind of interactive messages can be cut into one periodic task, and a delay influence factor of each periodic task is set so that the system can ensure the timely delivery of the interactive message.

The delay influence factor includes a high delay influence factor, a medium delay influence factor, and a low delay influence factor. A first preset period value and a second preset period value of an interaction period are set. When the interaction period value is less than or equal to the first preset period value, the delay influence factor is high delay influence factor, and the delay influence factor value is a first preset delay influence factor value; when the interaction period value is greater than or equal to the second preset period value, the delay influence factor is a low delay influence factor, and the delay influence factor value is the second preset delay influence factor value; when the interaction period value is between the first preset period value and the second preset period value, the delay influence factor is medium delay influence factor, and the delay influence factor value is calculated by a linear function, the linear function being linearly determined by a straight line formed by the first preset delay influence factor value and the second preset delay influence factor value.

Illustratively, Table 1 shows the relationship between the delay influence factor and the interaction period. The first preset period value is 30 ms, and the second preset period value is 100 ms; the first preset delay influence factor value is 100, the second preset delay influence factor value is 1, and the linear function is y=−1.428x+142.85, where x is an interaction period value. The interaction periods of less than 30 ms are uniformly set to have a high delay influence factor, and the delay influence factor value is 100; the interaction periods greater than 100 ms are uniformly set to have a low delay influence factor, and the high delay influence factor value is 1; the interaction period is calculated by a linear function y in the middle interval between 30 ms and 100 ms.

TABLE 1

| the relationship between the delay influence factor and the interaction period | | |
|---|---|---|
| Interaction period | Influence factor | Description |
| ≤30 ms | 100 | High |
| 30 ms < interaction period x < 100 ms | −1.428x + 142.85 | Medium, x is the interaction period value |
| ≥100 ms | 1 | Low |

The safety certification is required for the battery pack to open the high voltage system. The general requirements for the safety certification of a battery pack include:

1. a link maintenance message; and
2. a command to turn on and turn off a relay needing to be sent in a periodically verifiable manner.

For point 1, during the connection between the connection apparatus and the battery pack, it is only necessary to ensure that the link between the two remains connected.

With regard to point 2, by cutting each kind of interaction messages into one periodic task, and setting a delay influence factor for each periodic task, and with the scenario that according to the relationship between the delay influence factor and the interaction period, information can be periodically and timely exchanged between the connection apparatus and the battery pack, and multiple pieces of information possibly need to be exchanged concurrently, the system ensures that the interaction message is timely delivered, and thus the command of turning on and turning off the relay can be ensured to be sent in a periodically verifiable manner.

In the present embodiment, by cutting a plurality of interactive signals or a plurality of interaction messages existing between the battery pack detection connection apparatus and the VCI and the battery pack into periodic tasks, setting a delay influence factor of each periodic task, and by means of task subdivision cutting, and setting a delay influence factor, the timeliness of interaction information, the timeliness of task execution, and the accuracy of an output signal are ensured as far as possible.

In one embodiment, multiple tasks in the battery pack detection connection apparatus are required to be executed concurrently and this can be performed by using a time slice segmentation method. As long as the time slice for each task execution is as short as possible, it will not affect the response of other tasks. The present invention uses MCU to perform concurrent tasks, and can show good concurrent performance.

Figure 8:
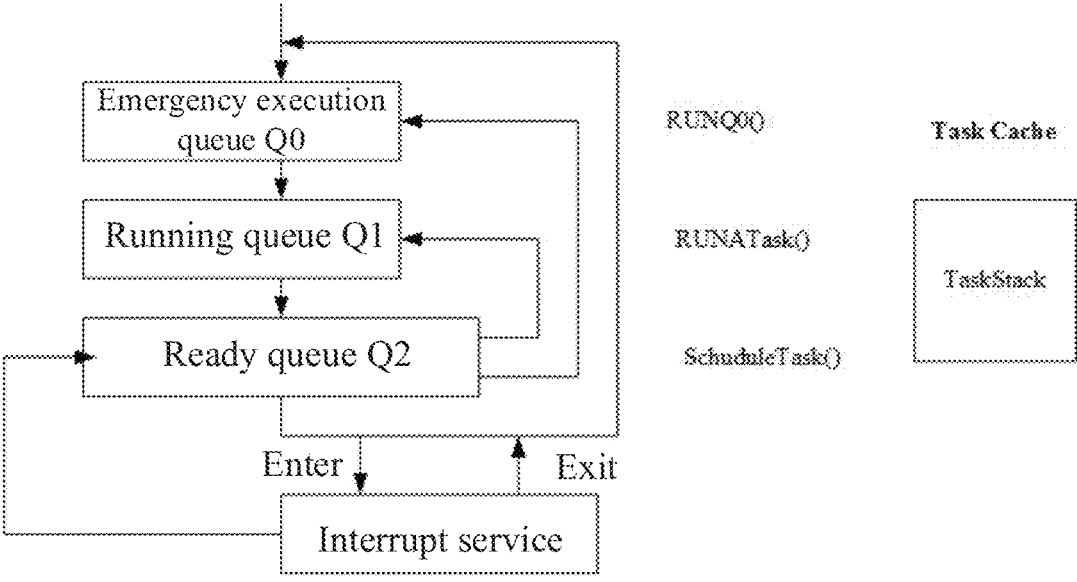
FIG. 8 is a schematic diagram of multi-task concurrent execution control logic in a battery pack detection connec-tion apparatus according to the present invention.

As shown in FIG. 8, FIG. 8 is a schematic diagram of multi-task concurrent execution control logic in a battery pack detection connection apparatus according to the present invention.

The battery pack detection connection apparatus is divided into three queues at the software level: a ready queue Q2, a running queue Q1, and an emergency execution queue Q0.

The ready queue Q2 is used for storing a task waiting to be executed; the running queue Q1 is used for storing a task that is due to be executed or a task with a medium or low delay influence factor; and the emergency execution queue Q0 is used for storing an emergency execution task or a task with a high delay influence factor. The task waiting to be executed comprises a task sent by VCI to the MCU, wherein the same is sent into the ready queue Q2 waiting to be executed after being processed by an interrupt program, and/or a periodic task between the connection apparatus and the battery packet.

The task affiliation in the ready queue Q2 is determined according to a task attribute or a delay influence factor, including scenarios as follows: if a task is event-type, quite urgent, belonging to an emergency execution task, the task is put into an emergency execution queue Q0 for execution; for periodic tasks, if a task has a high delay influence factor, the task is put into the emergency execution queue Q0 for execution, and the emergency execution queue Q0 uses a scheduling strategy of FIFO (First Input First Output) for execution to ensure the timeliness of task execution; and if the delay influence factor of a task is medium or low, the task is put into the running queue Q1 for execution, and the running queue Q1 firstly selects the task with a high delay influence factor value for execution, and performs execution under the same delay influence factor using the scheduling strategy of FIFO.

For example, the above-mentioned task exceeding the first preset delay influence factor value 100 is moved to be executed by the emergency execution queue Q0, and the emergency execution queue Q0 is executed using a scheduling policy of FIFO. A task lower than the first preset delay influence factor value of 100, for example, a task with a medium or low delay influence factor, is moved to the running queue Q1 for execution. A task with a high delay influence factor value is first selected in the running queue Q1 for execution, and is executed using the scheduling strategy of FIFO under the same delay influence factor.

In this embodiment, by constructing multi-task concurrency and supporting the concurrent execution of multiple tasks, the coexistence problem of an event-driven task and a periodic execution task is solved, and a control environment for the concurrent operation of signal modules and multiple function generators is provided. The method of time slice segmentation is used to subdivide tasks, supporting task concurrent scheduling, supporting subtle level of time scheduling particles, and meeting the requirements of vehicle information interaction delay control. At the same time, the software level is divided into and provided with three queues, namely, a ready queue Q2, a running queue Q1, and an emergency execution queue Q0, as well as a delay influence factor to ensure the timeliness of interactive information, the timeliness of task execution, and the accuracy of output signals as far as possible.

In one embodiment, the MCU executes concurrent tasks according to a preset execution policy. The preset execution policy comprises steps as follows: MCU first executes an emergency execution task in the emergency execution queue Q0, takes out one task for execution from the running queue Q1 after the execution is completed, and then checks whether there is a need for an emergency execution task or a task due to be executed in the ready queue Q2, and if so, the emergency execution task is assigned to the emergency execution queue Q0 for execution or the task due to be executed is assigned to the running queue Q1 for execution.

In interactive signals of the battery pack, the execution delay of most tasks is on the order of milliseconds, and the delay of a small part of signals is on the order of microseconds. In order to ensure that the task is responded to in time, the timer of the connection apparatus is accurate to the microsecond level. The time accuracy of the task moving from the ready queue Q2 to the emergency execution queue Q0 or the running queue Q1 is controlled to the microsecond level.

In this embodiment, the MCU executes concurrent tasks according to the preset execution strategy, supports concurrent scheduling of tasks, supports subtle levels of time scheduling particles, ensures that tasks are timely responded to, and meets the requirements of automobile information interaction delay control.

In one embodiment, in part of interactive signals between the battery pack detection connection apparatus and the battery pack, the signal hold time is very short, i.e. it is a short delay retention, which is implemented with a loop waiting method within the task to ensure the accuracy of the delay time as much as possible.

Figure 9:
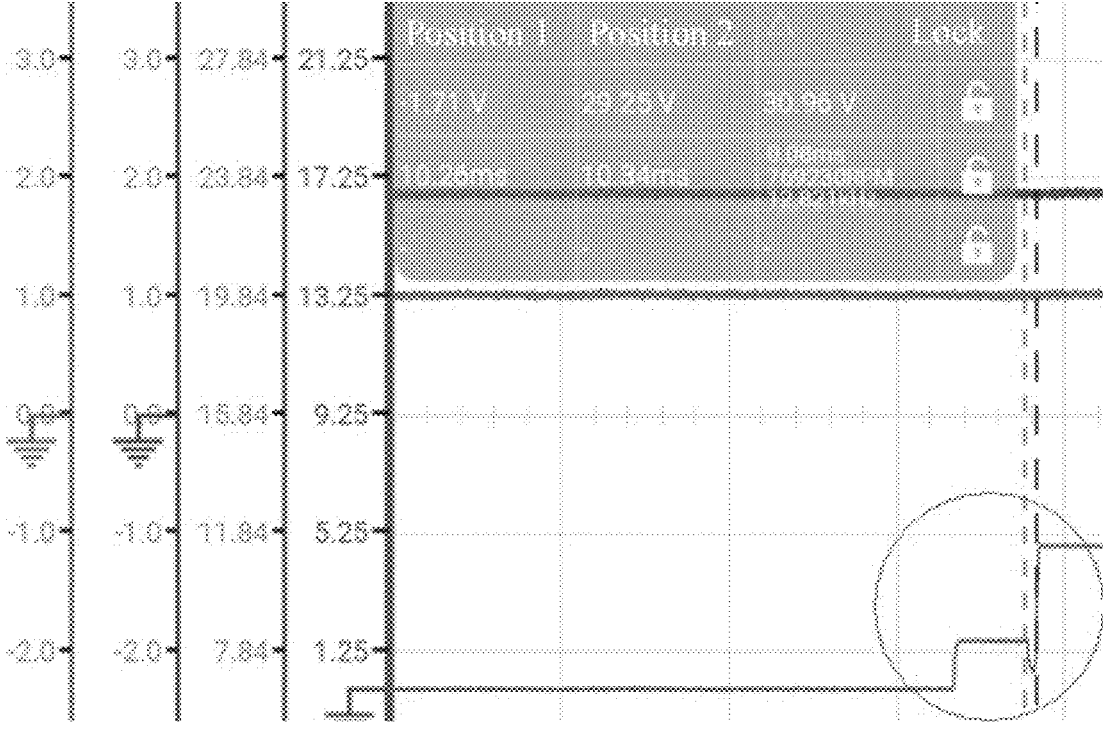
FIG. 9 is a schematic diagram of a partial interactive signal short delay holding between a battery pack detection connection apparatus and a battery pack according to the present invention.

In part of the interactive signals between the battery pack detection connection apparatus and the VCI and the battery pack, the signal hold time is very short, as indicated by the circle in FIG. 9, which is only 0.08 ms. For such a short delay retention, it is a conventional practice to resort to a task scheduling method for implementation. However, if this short delay hold time is implemented by using a task scheduling method, it is difficult to control the accuracy of this period of time due to the overhead of system scheduling, or an error of a timer, or the scenario that the task cannot be scheduled in time, and it is impossible to meet the switching requirements by using the conventional task scheduling method. In the present invention, a loop waiting method is used to achieve a short delay holding within a task to ensure the accuracy of the delay time as much as possible.

The loop waiting method includes keeping the signal occupying system resources (such as CPU resources) during its hold time, keeping the state of no task switching and being in the waiting state, until the signal hold time expires.

In the present embodiment, by implementing the short delay holding using the loop waiting method, it is possible for the interactive signals between the battery pack detection connection apparatus and the battery pack with a very short hold time to maintain low delay without task switching, thereby ensuring the accuracy of the delay time as much as possible.

In one embodiment, the MCU performs signal feature reconstruction on the extracted change features of the signal, comprising:

S1, determining all the states in one period of the waveform and the numerical value of each state according to the change features of the signal;

S2, in one period, setting a function generator or a signal module to execute and output a numerical value in the current state and a numerical value in the next state; and S3, repeating step S2, and setting the function generator or the signal module to output waveforms of several periods according to requirements.

The process of signal reconstruction is further illustrated below by taking FIG. 6 as an example.

The waveform features of FIG. 6 can be expressed as a sequence of the following equation (2), where the hold time units are milliseconds.

$$Sig=\{(0.35,1.5),(0.85,2),(0.74,2),(2.4,4.5),(line(2.4,0),\\ 1.4),(0,510)\} \qquad (2)$$

From the sampled waveform of FIG. 6, the waveform includes a plurality of states. Set state symbol as state, linear symbol as line, and linear segment as segs. Set, in the initial state, the state as −1, the line is initialized as 1 and segs is initialized as 14 (100 us for one sample replenishment, and 1.4 ms for a total of 14 sample replenishments). The waveform reconstruction process is as follows:

(1) If the state is less than 0, then (2); if state=0, then (3); if state=1, then (4); if state==2, then (5); if state==3, then (6); if state==4, then execute (7).

(2) Set the function generator output voltage to 0.35V, state=0, and change the next scheduling delay to 1.5 ms.

(3) Set the function generator output voltage to 0.85V, state=1, and change the next scheduling delay to 2 ms.

(4) Set the function generator output voltage to 0.74V, state=2, and change the next scheduling delay to 2 ms.

(5) Set the function generator output voltage to 2.4V, state=3, and change the next scheduling delay to 4.5 ms.

(6) If line≤segs, voltage=2.4-2.4/1400*(line*100), and line=line+1, set the output voltage as voltage, and change the next scheduling delay as 100 us; and if line>14, line=1, and state=4, go to (7) for execution.

(7) Set the function generator output voltage to 2.4V, state=−1, and change the next scheduling delay to 510 ms.

By this periodic scheduling, the desired waveform can be output by the function generator.

In one embodiment, the MCU performs signal feature reconstruction on the extracted change features of the signal, and transmits the reconstructed signal feature to a function generator or signal module according to an attribute of the reconstructed signal feature, and controls the function generator or signal module to output a reconstructed signal waveform according to the reconstructed signal feature; including steps as follows:

the MCU judges the attribute of the reconstructed signal feature, and if the reconstructed signal feature is a first-type waveform signal, then the reconstructed signal feature is transmitted to the function generator, and the function generator is controlled to output a reconstructed signal waveform according to the reconstructed signal feature; and the function generator outputs a first-type waveform signal exchanged between a vehicle and the battery pack based on the reconstructed signal features transmitted by the MCU.

If the reconstructed signal feature is a second-type waveform signal, then the reconstructed signal feature is transmitted to the signal module, and the signal module is controlled to output a reconstructed signal waveform according to the reconstructed signal feature; and the signal module outputs a second-type waveform signal exchanged between the vehicle and the battery pack according to the reconstructed signal feature transmitted by the MCU.

In the present embodiment, by adopting two control modes of a function generator and a signal module, a first-type complex waveform signal is implemented by the function generator, and the function generator outputs the first-type waveform signal exchanged between a vehicle and the battery pack according to the reconstructed signal feature transmitted by the MCU. The second-type simple waveform signal is implemented by a signal module, and the signal module outputs the second-type waveform signal exchanged between the vehicle and the battery pack according to the reconstructed signal feature transmitted by the MCU such that it can realize various signals required for the interaction between the battery packs, solve the problem of signal versatility, reduce the design cost, enhance the design function, can use the same hardware to match different brands of automobiles or multiple vehicle models of the same brand, increase the use range of the hardware, and effectively exert the versatility of the hardware.

In one embodiment, as shown in FIG. 1, the battery pack detection connection apparatus further comprises: a power module 15 for supplying power to the microcontroller Unit 11, the function generator 12, the signal module 13, and the communication module 14.

Figure 10:
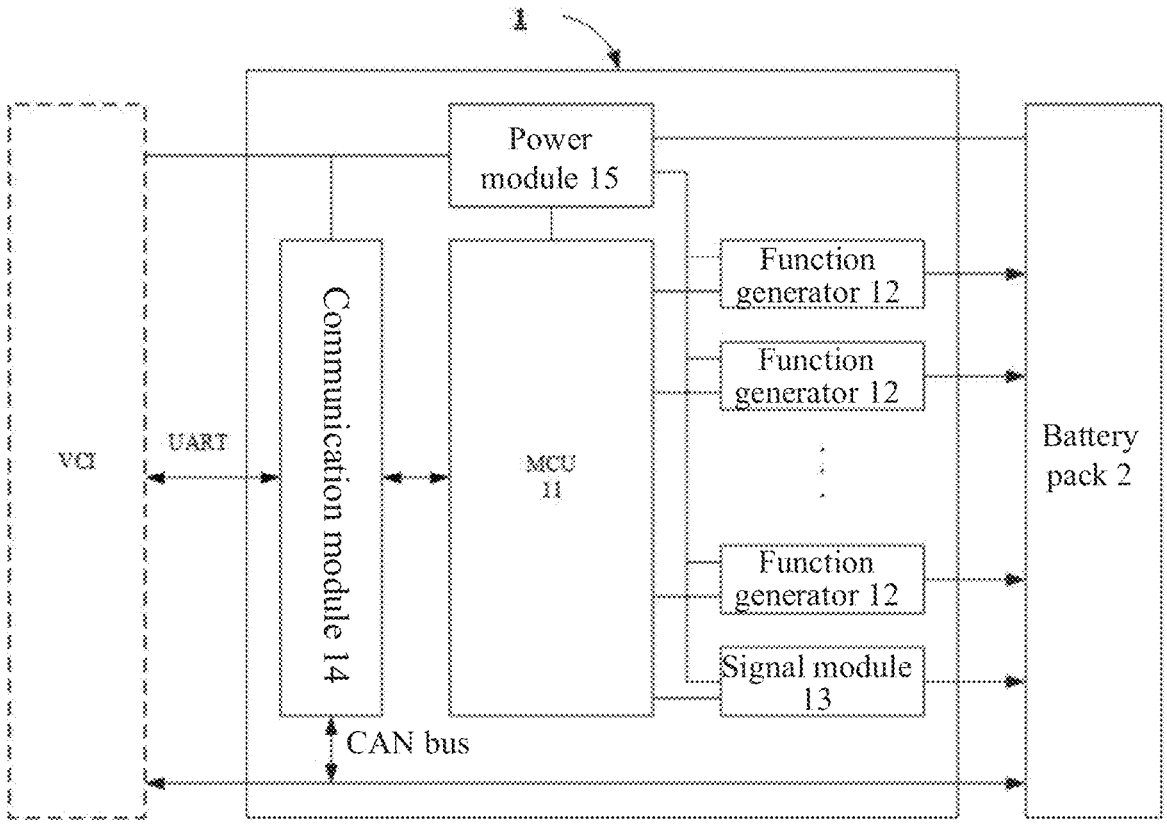
FIG. 10 is a schematic structural diagram of a battery pack detection system according to the present invention.

Based on the same concept, in one embodiment, as shown in FIG. 10, the present invention provides a battery pack detection system including a battery pack 2 and a battery pack detection connection apparatus 1 according to any one of the embodiments described above. The battery pack detection connection apparatus 1 is communicatively connected to the battery pack 2 for constructing an interactive signal between an automobile and the battery pack according to a signal inputted from the outside and outputting the same to the battery pack 2.

In the present embodiment, the battery pack detection connection apparatus 1 is consistent with the battery pack detection connection apparatus 1 according to any one of the above-described embodiments, and the specific structure and function can be referred to the battery pack detection connection apparatus 1 according to any one of the above-described embodiments, which will not be described in detail herein.

In the present embodiment, the battery pack detection system comprises a battery pack and a battery pack detection connection apparatus. The battery pack detection connection apparatus is communicatively connected to the battery pack, and according to an externally input signal, an interactive signal between an automobile and the battery pack is constructed and output to the battery pack. The battery pack detection connection apparatus comprises an MCU, at least one function generator, a signal module, and a communication module. The microcontroller Unit is communicatively connected to the VCI, function generator, and signal module through a communication module to extract the change features of a signal externally transmitted to the MCU via the VCI, perform signal feature reconstruction on the extracted change feature of the signal, transmit the reconstructed signal feature to the function generator or the signal module according to the attribute of the reconstructed signal feature, control the function generator to output a first-type waveform signal exchanged between a vehicle and the battery pack according to the reconstructed signal feature, or control the signal module to output a second-type waveform signal exchanged between a vehicle and the battery pack according to the reconstructed signal feature. Therefore, by adopting two control modes of the function generator and signal module, the first-type of complex waveform signal is realized by a function generator, and the second-type of simple waveform signal is realized by the signal module such that various signals required for battery pack interaction can be realized, the problem of signal universality can be solved, the design cost can be reduced, and the design function can be enhanced; this supports the simultaneous output of multipath signals, adapts to the requirements of complex test environment, and ensures the timeliness of interactive information as far as possible, so as to solve the problems of interactive signal differences and inconsistent certification schemes in different brands of automobiles or various vehicle models of the same brand. Therefore, the same hardware can be used to match different brands of automobiles or various vehicle models of the same brand, the scope of hardware use can be increased, and the universality of hardware can be effectively played.

It requirements to be noted that the above embodiment of the battery pack detection system and the embodiment of the battery pack detection connection apparatus belong to the same concept. The specific implementation process is detailed in the embodiments of the battery pack detection connection apparatus, and the technical features in the embodiments of the battery pack detection connection apparatus are correspondingly applicable in the embodiment of the battery pack detection system, and will not be repeated herein.

It requirements to be noted that the terms "comprises", "comprising", or any other variation thereof, are intended to cover a non-exclusive inclusion, such that a process, a method, an article, or an apparatus that comprises a list of elements not only includes those elements but also includes other elements not expressly listed or elements inherent to such process, method, article or apparatus. An element defined by the phrase "including one" does not, without more constraints, preclude the existence of additional identical elements in the procedure, method, article, or apparatus that includes the element.

The above-mentioned serial numbers of the embodiments of the present invention are merely for the purpose of description and do not represent the advantages and disadvantages of the embodiments.

Finally, it should be noted that: the above embodiments are merely illustrative of the technical solutions of the present invention, rather than limiting it; combinations of technical features in the above embodiments or in different embodiments are also possible under the idea of the present invention, and the steps can be implemented in any order; there are many other variations of the different aspects of the present invention as described above, which are not provided in detail for the sake of brevity; although the present invention has been described in detail with reference to the foregoing embodiments, those of ordinary skills in the art will appreciate that the technical solutions disclosed in the above-mentioned embodiments can still be modified, or some of the technical features thereof can be replaced by equivalents; such modifications or replacements do not depart the essence of the corresponding technical solution from the scope of the technical solutions of embodiments of the present invention.

The invention claimed is:

1. A battery pack detection connection apparatus, comprising: a microcontroller unit, at least one function generator, a signal module, and a communication module; wherein:

the communication module is used for communicating with a vehicle communication interface and a battery pack by using a preset bus;

the microcontroller unit is respectively communicatively connected to the vehicle communication interface, the function generator, and the signal module via the communication module, and is used for extracting a change feature of a signal input externally via the vehicle communication interface, performing signal feature reconstruction on the extracted change feature of the signal, transmitting the reconstructed signal feature to the function generator or the signal module according to an attribute of the reconstructed signal feature, and controlling the function generator or the signal module to output a reconstructed signal waveform according to the reconstructed signal feature;

the function generator is used for outputting a first-type waveform signal exchanged between a vehicle and the battery pack according to the reconstructed signal feature transmitted by the microcontroller unit; and the signal module is used for outputting a second-type waveform signal exchanged between a vehicle and the battery pack according to the reconstructed signal feature transmitted by the microcontroller unit.

2. The battery pack detection connection apparatus according to claim 1, wherein the preset bus comprises a CAN bus, wherein the battery pack detection connection apparatus is connected to the CAN bus, the battery pack detection connection apparatus provides all signals for interfacing with the battery pack, and a communication interaction with the battery pack is performed via the CAN bus.

3. The battery pack detection connection apparatus according to claim 2, wherein the preset bus comprises a UART, and the battery pack detection connection apparatus communicates with the vehicle communication interface via the UART or the CAN bus.

4. The battery pack detection connection apparatus according to claim 1, wherein the microcontroller unit is connected to the vehicle communication interface and extracts the change feature of the signal input externally through the vehicle communication interface, comprising: with regard to a periodic signal input externally through the vehicle communication interface, firstly performing signal period decomposition, and then extracting a change feature of the signal within one signal period; wherein the extracting the change feature of the signal is implemented by using a sampling method, and the signal is sampled at a certain time interval to acquire a sampling voltage of the signal.

5. The battery pack detection connection apparatus according to claim 4, wherein the microcontroller unit represents the extracted change features of the signal by using a preset sequence pair, wherein in the preset sequence pair, if part of the signal is continuously change according to a certain law within a certain time of a period, the part of the signal is be represented by a function, and the function is nested in the preset sequence pair.

6. The battery pack detection connection apparatus according to claim 5, wherein the preset sequence pair comprises a sequence pair of a voltage and hold time.

7. The battery pack detection connection apparatus according to claim 5, wherein the microcontroller unit performs signal feature reconstruction on the extracted change features of the signal, comprising:

S1, determining all states in one period of a waveform and a numerical value of each state according to the change feature of the signal; and S2, in one period, setting the function generator or the signal module to execute and output a numerical value in a current state and a numerical value in a next state.

8. The battery pack detection connection apparatus according to claim 1, wherein a plurality of interactive signals or a plurality kinds of interactive signals or interaction messages exist between the battery pack detection connection apparatus and the vehicle communication interface and the battery pack, each kind of interactive signal or message is cut into one periodic task, and a delay influence factor of each periodic task is set.

9. The battery pack detection connection apparatus according to claim 8, wherein the delay influence factor comprises a high delay influence factor, a medium delay influence factor, and a low delay influence factor;

when an interaction period value is less than or equal to a first preset period value, the delay influence factor is the high delay influence factor, and a value of the delay influence factor value is a first preset delay influence factor value;

when the interaction period value is greater than or equal to a second preset period value, the delay influence factor is the low delay influence factor, and the delay influence factor value is a second preset delay influence factor value;

and when the interaction period value is between the first preset period value and the second preset period value, the delay influence factor is the medium delay influence factor, and the delay influence factor value is calculated by a linear function, wherein the linear function is linearly determined by a straight line formed by the first preset delay influence factor value and the second preset delay influence factor value.

10. The battery pack detection connection apparatus according to claim 9, wherein the battery pack detection connection apparatus is divided into three queues at a software level: ready queue, running queue, and emergency execution queue; wherein:

the ready queue is used for storing a task waiting to be executed; the running queue is used for storing a task that is due to be executed or a task with a medium or low delay influence factor; and the emergency execution queue is used for storing an emergency execution task or a task with a high delay influence factor; wherein the task waiting to be executed comprises a task sent by the vehicle communication interface to the microcontroller Unit, and/or a periodic task between the battery pack detection connection apparatus and the battery pack.

11. The battery pack detection connection apparatus according to claim 10, wherein a task affiliation in the ready queue is determined according to a task attribute or a delay influence factor, comprising scenarios as follows: if the task is event-type and quite urgent, the task is put into the emergency execution queue for execution; for a periodic task, if the delay influence factor of the task is the high delay influence factor, the task is put into the emergency execution queue for execution, and the emergency execution queue uses a First Input First Output scheduling strategy for execution to ensure a timeliness of task execution; and if the delay influence factor of a task is the medium delay influence factor or the low delay influence factor, the task is put into a running queue for execution, and the running queue firstly selects a task with a high delay influence factor value for execution, and executes the task with a First Input First Output scheduling strategy under a same delay influence factor.

12. The battery pack detection connection apparatus according to claim 9, wherein the microcontroller unit executes concurrent tasks according to a preset execution strategy, wherein the preset execution strategy comprises: the microcontroller Unit first executing an emergency execution task in the emergency execution queue, taking out one task for execution from the running queue after the execution is completed, and then checking whether there is a need for the emergency execution task or a task due to be executed in the ready queue, and if so, assigning the emergency execution task to the emergency execution queue for execution or assigning the task due to be executed to the running queue for execution.

13. The battery pack detection connection apparatus according to claim 1, wherein in part of interactive signals between the battery pack detection connection apparatus and the battery pack, a signal hold time is very short, i.e. a short delay holding, and this is implemented by using a loop waiting method within a task.

14. The battery pack detection connection apparatus according to claim 1, further comprising: a power module for supplying power to the microcontroller unit, the signal module, and the function generator.

15. A battery pack detection system, comprising a battery pack and a battery pack detection connection apparatus comprising a microcontroller unit, at least one function generator, a signal module, and a communication module; wherein:

the communication module is configured for communicating with a vehicle communication interface and the battery pack by using a preset bus;

the microcontroller unit is respectively communicatively connected to the vehicle communication interface, the at least one function generator, and the signal module via the communication module, and is used for extracting a change feature of a signal input externally via the vehicle communication interface, performing signal feature reconstruction on the extracted change feature of the signal, transmitting the reconstructed signal feature to the function generator or the signal module according to an attribute of the reconstructed signal feature, and controlling the function generator or the signal module to output a reconstructed signal waveform according to the reconstructed signal feature;

the function generator is used for outputting a first-type waveform signal exchanged between a vehicle and the battery pack according to the reconstructed signal feature transmitted by the microcontroller unit; and the signal module is used for outputting a second-type waveform signal exchanged between a vehicle and the battery pack according to the reconstructed signal feature transmitted by the microcontroller unit;

wherein the battery pack detection connection apparatus is communicatively connected to the battery pack for, according to an externally input signal, constructing an interactive signal between an automobile and the battery pack to be output a same to the battery pack.

* * * * *